United States Patent
Arvelo et al.

(10) Patent No.: US 9,258,925 B2
(45) Date of Patent: *Feb. 9, 2016

(54) SELECTIVE CLAMPING OF ELECTRONICS CARD TO COOLANT-COOLED STRUCTURE

(71) Applicant: INTERNATIONAL BUSINESS MACHINES CORPORATION, Armonk, NY (US)

(72) Inventors: Amilcar R. Arvelo, Poughkeepsie, NY (US); Mark A. Brandon, Poughkeepsie, NY (US); Levi A. Campbell, Poughkeepsie, NY (US); Tan D. Doan, Wappingers Falls, NY (US); Michael J. Ellsworth, Jr., Poughkeepsie, NY (US); Randall G. Kemink, Poughkeepsie, NY (US); Eric J. McKeever, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.
This patent is subject to a terminal disclaimer.

(21) Appl. No.: 14/528,052

(22) Filed: Oct. 30, 2014

(65) Prior Publication Data
US 2015/0052753 A1 Feb. 26, 2015

Related U.S. Application Data

(63) Continuation of application No. 13/782,357, filed on Mar. 1, 2013, now Pat. No. 9,144,178.

(51) Int. Cl.
*H05K 7/20* (2006.01)
*G06F 1/20* (2006.01)
(Continued)

(52) U.S. Cl.
CPC ............ *H05K 7/20254* (2013.01); *B23P 15/26* (2013.01); *G06F 1/20* (2013.01); *H01L 23/473* (2013.01); *H05K 7/20772* (2013.01); *H01L 2924/0002* (2013.01); *Y10T 29/4935* (2015.01)

(58) Field of Classification Search
CPC ........ H05K 7/20; H05K 7/20254; G06F 1/20; G06F 1/16; H01L 23/473; H01L 23/4093; B23P 15/26; F28F 7/00; F28F 13/00; Y10T 29/4935; Y10T 403/76
USPC ............... 361/679.46–679.54, 688, 689, 698, 361/699, 715–728, 752; 165/80.2, 80.4, 165/80.5, 104.26, 104.33, 185; 174/15.1, 174/16.3, 520, 547, 548; 62/259.2; 29/890.03, 890.035
See application file for complete search history.

(56) References Cited

U.S. PATENT DOCUMENTS 4,298,904 A 11/1981 Koenig
4,825,337 A  4/1989 Karpman
(Continued)

FOREIGN PATENT DOCUMENTS

CN  2015-90981 U   9/2010
DE     3522127 C2  10/1989

OTHER PUBLICATIONS

Arvelo et al., Office Action for U.S. Appl. No. 13/782,357, filed Mar. 1, 2013 (U.S. Patent Publication No. 2014/0247555 A1), dated Feb. 5, 2015 (9 pages).

*Primary Examiner* — Michail V Datskovskiy
(74) *Attorney, Agent, or Firm* — Margaret A. McNamara, Esq.; Kevin P. Radigan, Esq.; Heslin Rothenberg Farley & Mesiti P.C.

(57) ABSTRACT

Methods of fabricating cooling apparatuses are provided which include: providing a thermal transfer structure configured to couple to an electronics card, the thermal transfer structure including a clamping structure movable between opened and clamped positions; and providing a coolant-cooled structure configured to reside within, and be associated with a receiving slot of, an electronic system within which the electronics card operatively inserts, the coolant-cooled structure residing between the electronics card and, at least partially, the clamping structure when the transfer structure is coupled to the electronics card and the card is operatively inserted into the receiving slot, wherein the opened position facilitates insertion of the electronics card into the electronic system, and movement of the clamping structure to the clamped position facilitates clamping of the thermal transfer structure to the coolant-cooled structure, and thermal conduction of heat from the electronics card to the coolant-cooled structure.

17 Claims, 14 Drawing Sheets

(51) Int. Cl.
*B23P 15/26* (2006.01)
*H01L 23/473* (2006.01)

(56) References Cited

U.S. PATENT DOCUMENTS

| | | | |
|---|---|---|---|
| 4,958,257 A | 9/1990 | Wenke | |
| 5,057,968 A | 10/1991 | Morrison | |
| 5,153,815 A | 10/1992 | Suzuki et al. | |
| 5,946,189 A | 8/1999 | Koenen et al. | |
| 6,205,023 B1 | 3/2001 | Moribe et al. | |
| 6,349,035 B1 | 2/2002 | Koenen | |
| 6,393,853 B1 | 5/2002 | Vukovic et al. | |
| 6,665,184 B2 * | 12/2003 | Akselband | 361/699 |
| 6,674,643 B2 | 1/2004 | Centola et al. | |
| 6,829,145 B1 | 12/2004 | Corrado et al. | |
| 7,193,850 B2 * | 3/2007 | Pal | 361/700 |
| 7,193,854 B2 | 3/2007 | Bonomo et al. | |
| 7,212,409 B1 | 5/2007 | Belady et | |
| 7,336,493 B2 * | 2/2008 | Berkenbush et al. | 361/711 |
| 7,961,465 B2 | 6/2011 | Goldrian et al. | |
| 8,081,478 B1 | 12/2011 | Drexler et al. | |
| 8,094,453 B2 | 1/2012 | Campbell et al. | |
| 8,427,834 B2 | 4/2013 | Gerken et al. | |
| 8,570,744 B2 * | 10/2013 | Rau et al. | 361/702 |
| 8,854,818 B1 * | 10/2014 | Angelucci | 361/707 |
| 8,913,381 B2 * | 12/2014 | Noteboom et al. | 361/679.48 |
| 2011/0261526 A1 | 10/2011 | Atkins et al. | |
| 2012/0069526 A1 * | 3/2012 | Tissot | 361/720 |
| 2013/0128460 A1 * | 5/2013 | Rossi et al. | 361/699 |
| 2013/0194755 A1 * | 8/2013 | Ling et al. | 361/721 |
| 2013/0265695 A1 | 10/2013 | Canfield et al. | |
| 2013/0343005 A1 | 12/2013 | David et al. | |
| 2014/0247555 A1 | 9/2014 | Arvelo et al. | |

* cited by examiner

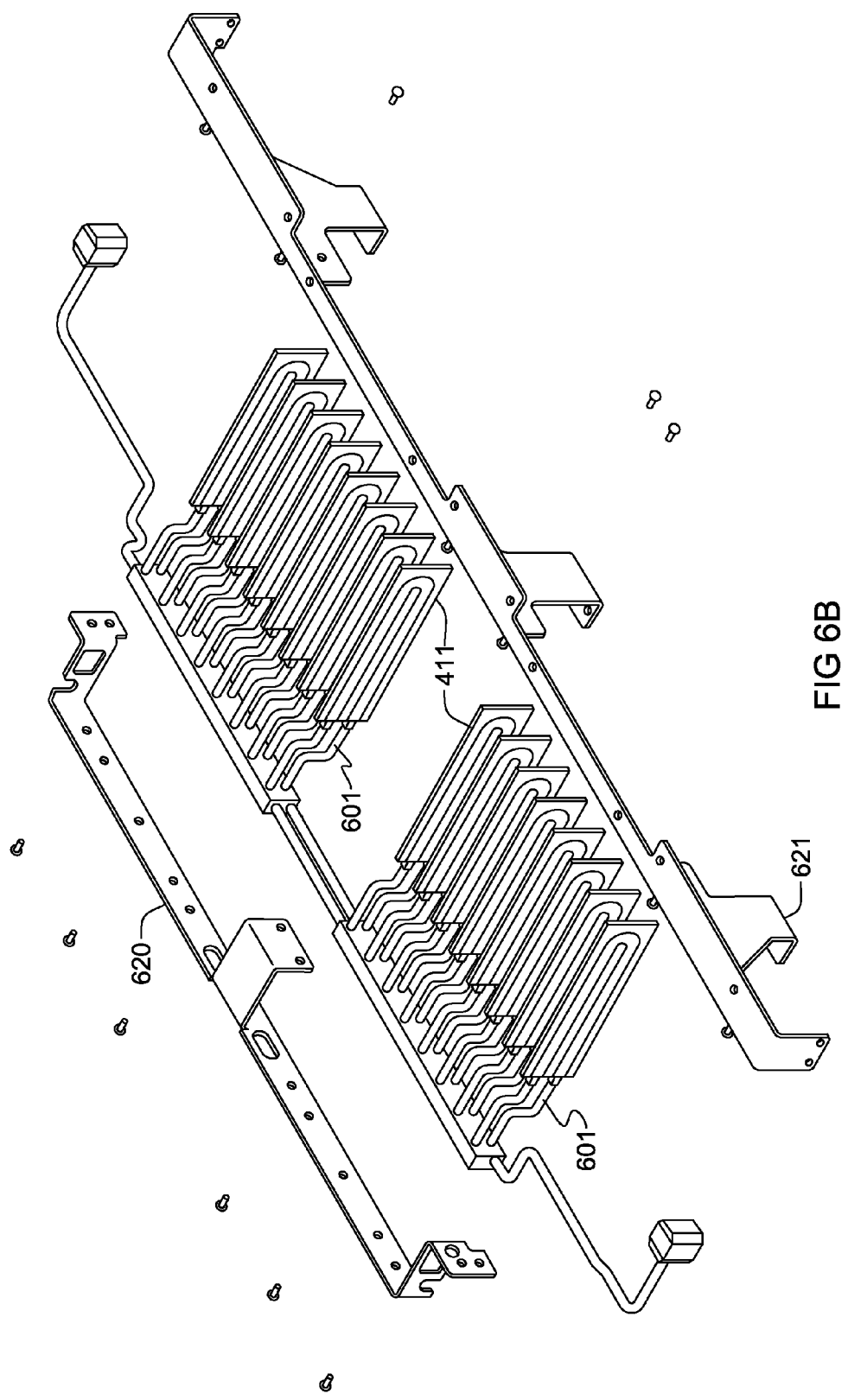

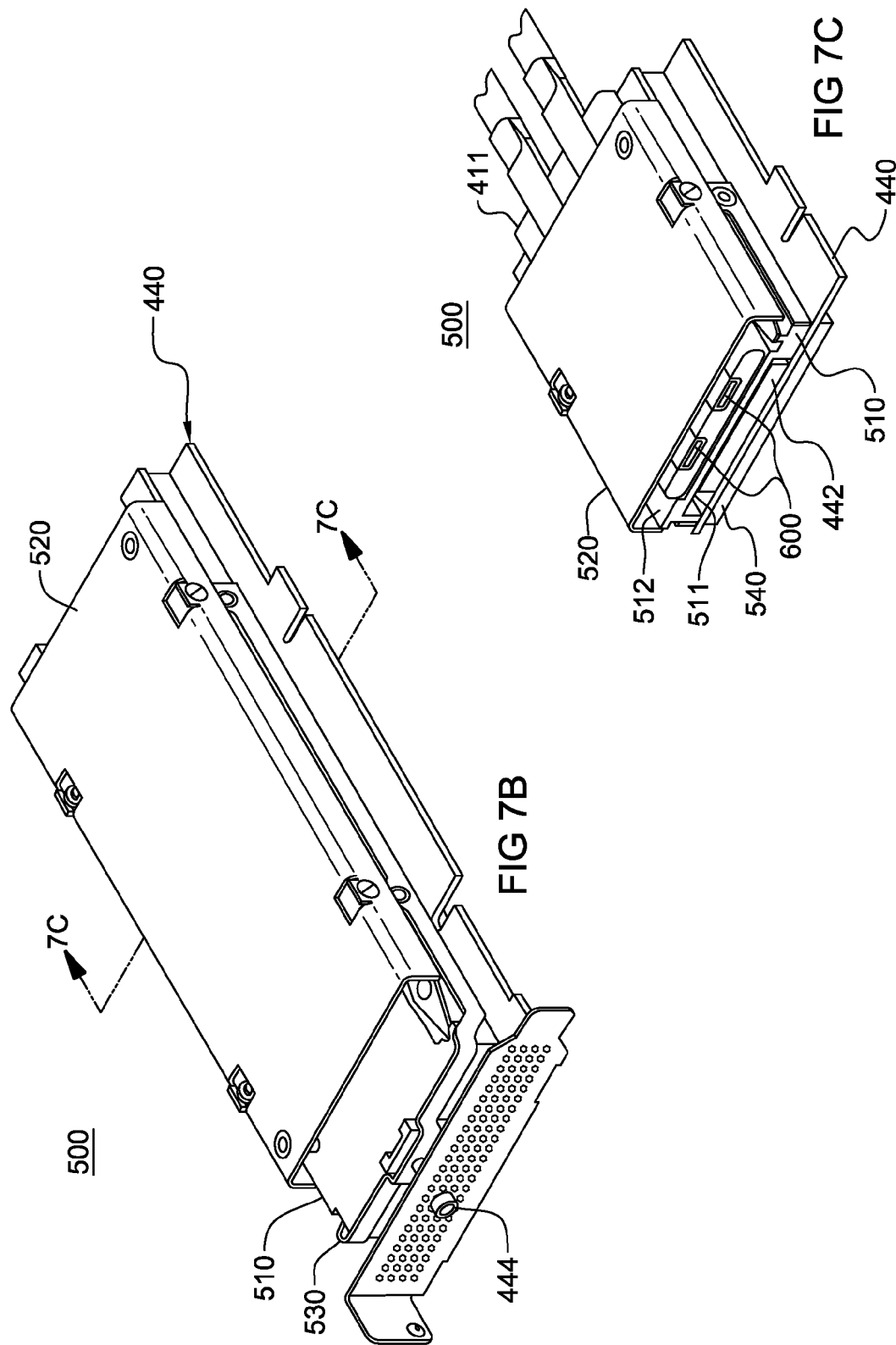

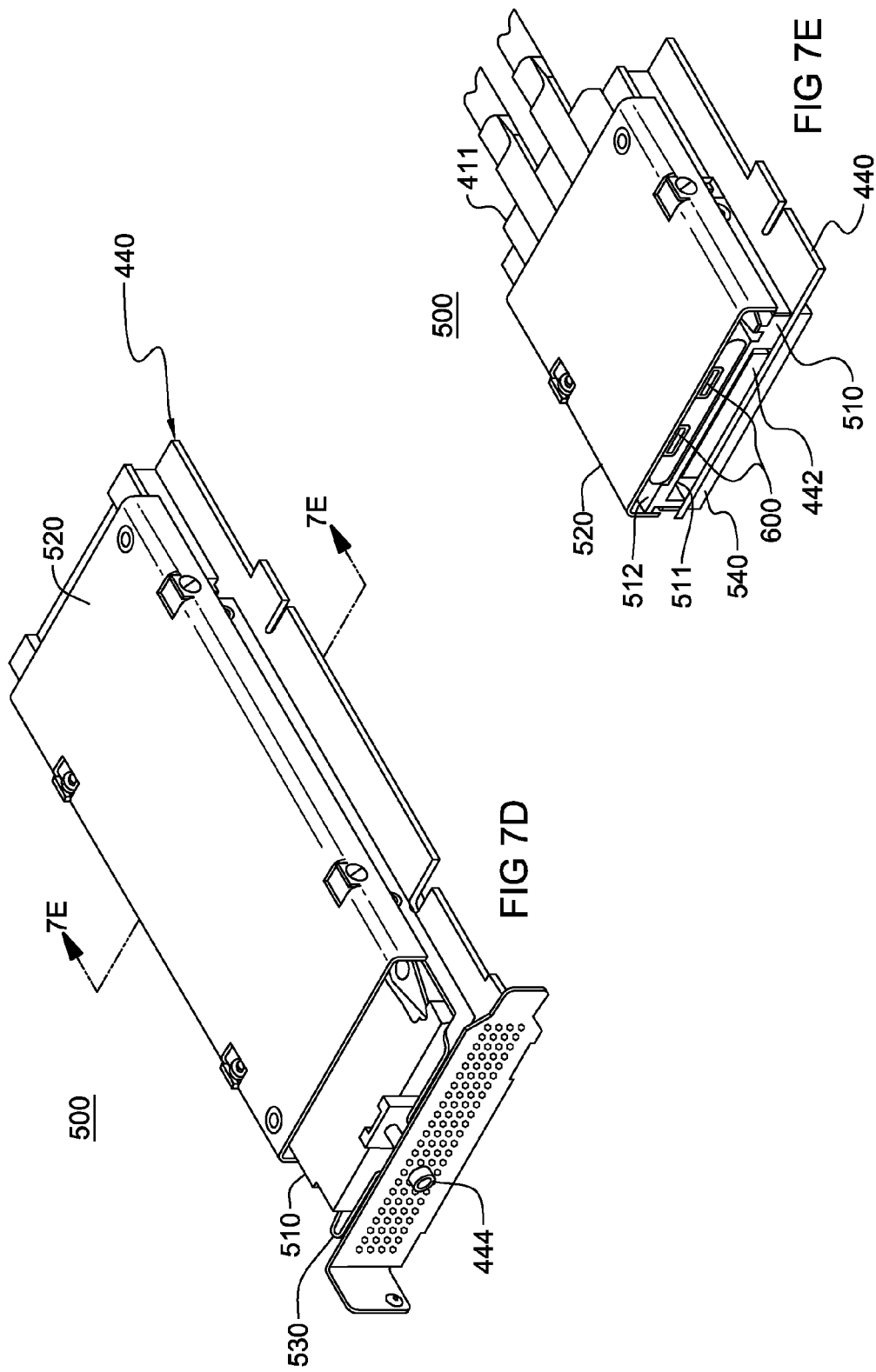

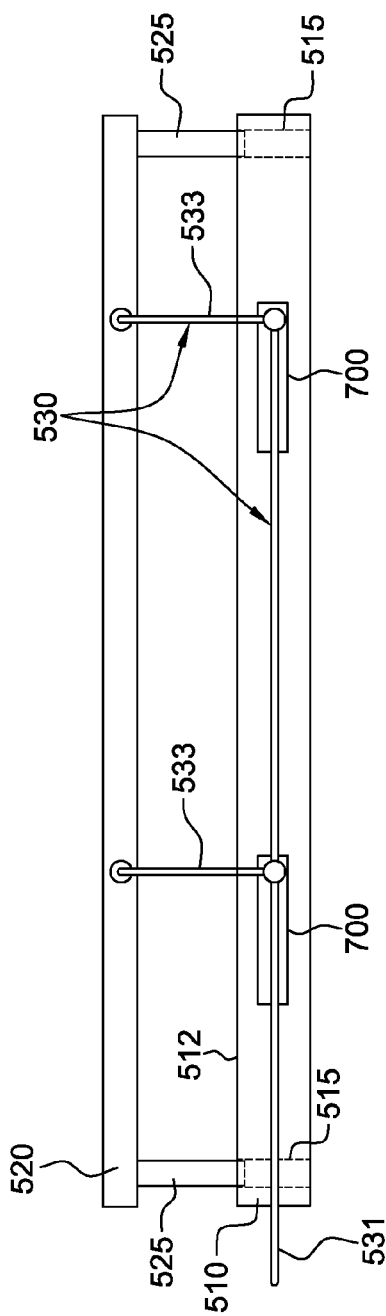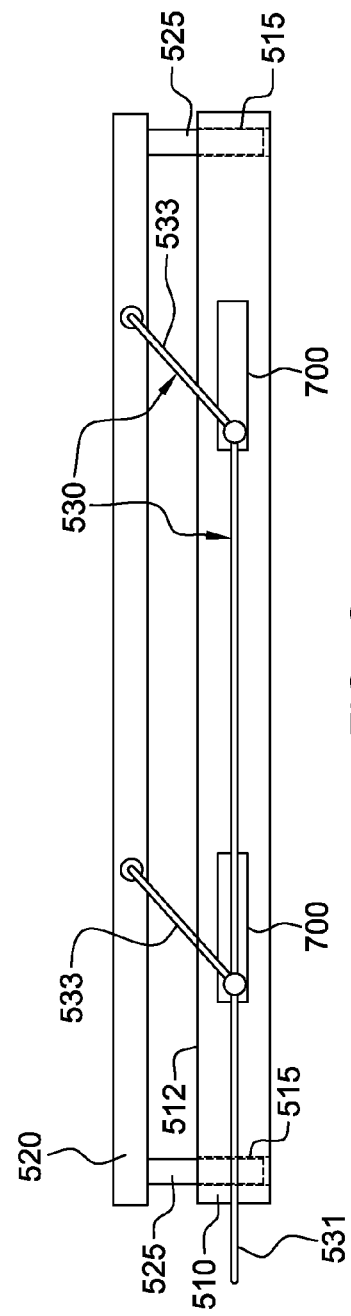

US 9,258,925 B2

SELECTIVE CLAMPING OF ELECTRONICS CARD TO COOLANT-COOLED STRUCTURE

CROSS-REFERENCE TO RELATED APPLICATION

This application is a continuation of U.S. Ser. No. 13/782,357, filed Mar. 1, 2013, entitled "Selective Clamping of Electronics Card to Coolant-Cooled Structure", which was published Sep. 4, 2014, as U.S. Patent Publication No. 2014/0247555 A1, and which is hereby incorporated herein by reference in its entirety.

BACKGROUND

As is known, operating electronic components, such as processor modules, produce heat. This heat should be removed from the components in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern electronic components and electronic systems containing such components, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

In one aspect, provided herein is a method which includes: providing a thermal transfer structure configured to couple to an electronics card and facilitate transfer of heat from the electronics card, the thermal transfer structure including a clamping structure movable between an opened position and a clamped position; and providing a coolant-cooled structure configured to reside within, and be associated with a receiving slot of, an electronic system within which the electronics card is to be operatively inserted, the coolant-cooled structure residing between the electronics card and, at least partially, the clamping structure of the thermal transfer structure when the thermal transfer structure is coupled to the electronics card and the electronics card is operatively inserted into the receiving slot of the electronic system, wherein the opened position of the clamping structure facilitates insertion of the electronics card into the electronic system with the coolant-cooled structure disposed between the electronics card and, at least partially, the clamping structure, and movement of the clamping structure to the clamped position facilitates clamping of the thermal transfer structure to the coolant-cooled structure, and thermal conduction of heat from the electronics card to the coolant-cooled structure.

Further, a method of fabricating a coolant-cooled electronic assembly is provided herein. The method includes: providing an electronic system comprising at least one receiving slot configured to facilitate operative insertion of the at least one electronics card into the electronic system, and at least one coolant-cooled structure disposed within the electronic system and associated with the at least one receiving slot, the at least one coolant-cooled structure comprising at least one coolant-carrying channel; and providing a cooling apparatus comprising at least one thermal transfer structure, one thermal transfer structure of the at least one thermal transfer structure being coupled to one electronics card of the at least one electronics card, the one thermal transfer structure including a clamping structure movable between an opened position and a clamped position; and wherein with operative insertion of the electronics card into one receiving slot of the at least one receiving slot of the electronic system, the one coolant-cooled structure associated with the one receiving slot resides between the one electronics card and, at least partially, the clamping structure, and wherein the opened position of the clamping structure facilitates operative insertion of the one electronics card into the one receiving slot of the electronic system with the coolant-cooled structure disposed between the one electronics card and, at least in partially, the clamping structure, and movement of the clamping structure to the clamped position facilitates clamping of the one thermal transfer structure to the one coolant-cooled structure, and thermal conduction of heat from the one electronics card to the one coolant-cooled structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6B is a partially exploded view of the cooling apparatus sub-assembly of FIG. 6A, in accordance with one or more aspects of the present invention;

FIG. 7B depicts the electronics card and thermal transfer structure of FIGS. 5A-5C & 7A, and illustrates the clamping structure in opened position, in accordance with one or more aspects of the present invention;

FIG. 7C is a cross-sectional elevational view of the electronics card and thermal transfer structure of FIGS. 7A & 7B, with a coolant-cooled structure shown disposed between the lid of the clamping structure and the thermal spreader of the thermal transfer structure, in accordance with one or more aspects of the present invention;

FIG. 7D depicts the electronics card and thermal transfer structure of FIGS. 5A-5C & 7A, and illustrates the clamping structure in clamped position, in accordance with one or more aspects of the present invention;

FIG. 7E is a cross-sectional elevational view of the electronics card and thermal transfer structure of FIGS. 7A & 7D, with a coolant-cooled structure shown disposed between the lid of the clamping structure and the thermal spreader of the thermal transfer structure, in accordance with one or more aspects of the present invention;

FIG. 7F is a schematic of one embodiment of a thermal transfer structure, wherein the clamping structure is disposed in opened position relative to, for instance, a thermal spreader of the thermal transfer structure, in accordance with one or more aspects of the present invention; and FIG. 7G is a schematic of the thermal transfer structure of FIG. 7F, with the clamping structure shown disposed in clamped position relative to the thermal spreader of the thermal transfer structure, in accordance with one or more aspects of the present invention.

DETAILED DESCRIPTION

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold wall" refer to thermally conductive structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold wall. In one example, the channel(s) may be formed by providing tubing extending through the coolant-cooled structure.

One example of coolant used within the cooling apparatuses and coolant-cooled electronic assemblies or systems disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components.

Figure 1:
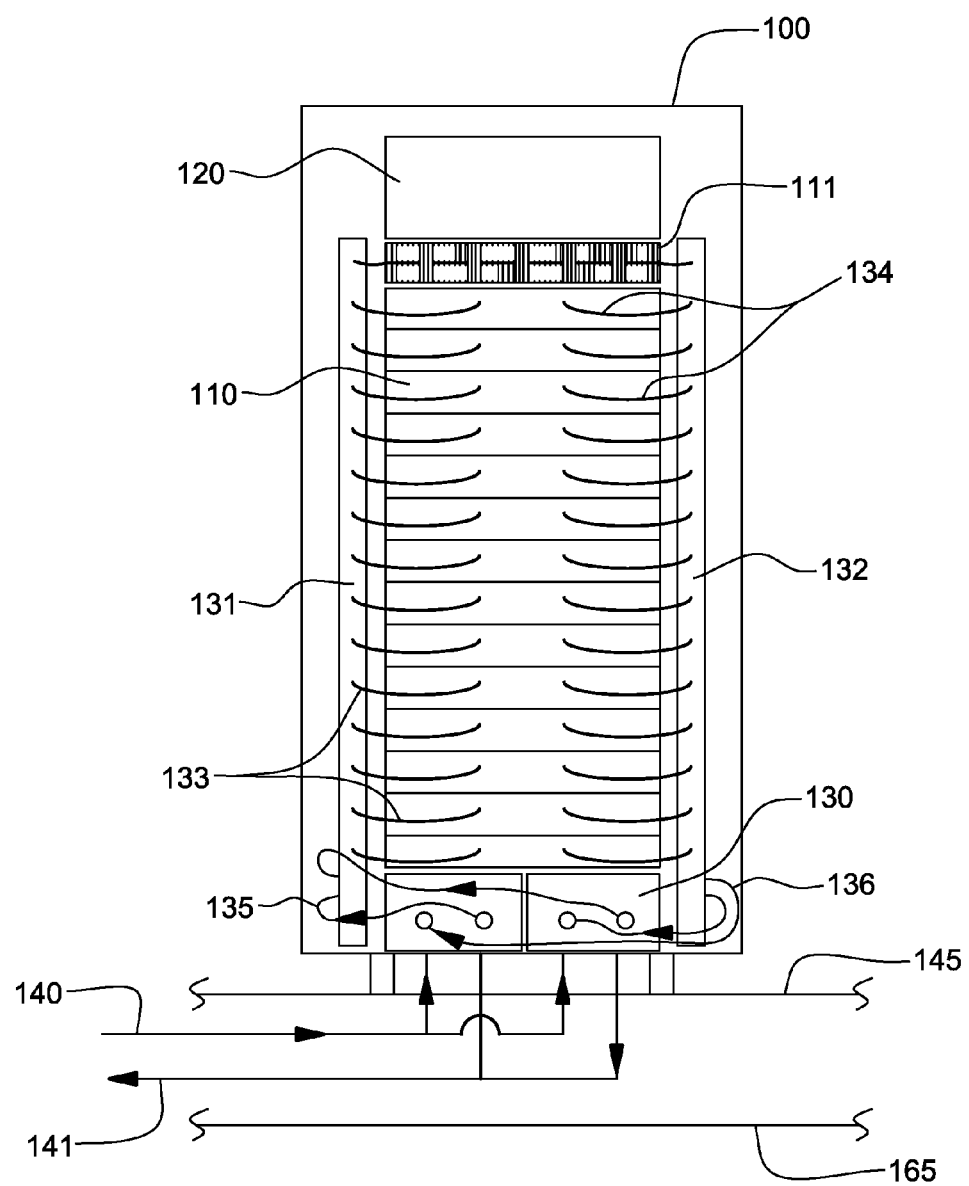
FIG. 1 is an elevational view of one embodiment of a coolant-cooled electronics rack comprising multiple coolant-cooled electronic systems, one or more of which may accommodate one or more electronics cards and a cooling apparatus, in accordance with one or more aspects of the present invention.

FIG. 1 depicts one embodiment of a liquid-cooled electronics rack 100 which employs a liquid-based cooling system. In one embodiment, liquid-cooled electronics rack 100 comprises a plurality of electronic systems 110, which comprise processor or server nodes, as well as (for instance) a disk enclosure or structure 111. By way of example only, a bulk power assembly 120 is shown disposed at an upper portion of liquid-cooled electronics rack 100, and two modular cooling units (MCUs) 130 are disposed in a lower portion of the coolant-cooled electronics rack. In the embodiments described herein, the coolant is assumed to be water or an aqueous-based solution, again, by way of example only.

In addition to MCUs 130, the cooling system includes a system coolant supply manifold 131, a system coolant return manifold 132, and manifold-to-node fluid connect hoses 133 coupling system coolant supply manifold 131 to coolant-cooled electronic structures 110, 111 and node-to-manifold fluid connect hoses 134 coupling the individual coolant-cooled electronic systems 110, 111 to system coolant return manifold 132. Each MCU 130 is in fluid communication with system coolant supply manifold 131 via a respective system coolant supply hose 135, and each MCU 130 is in fluid communication with system coolant return manifold 132 via a respective system coolant return hose 136.

As illustrated, heat load of the electronics structures is transferred from the system coolant to, for instance, cooler facility coolant supplied by facility coolant supply line 140 and facility coolant return line 141 disposed, in the illustrated embodiment, in the space between a raised floor 145 and a base floor 165.

Figure 2:
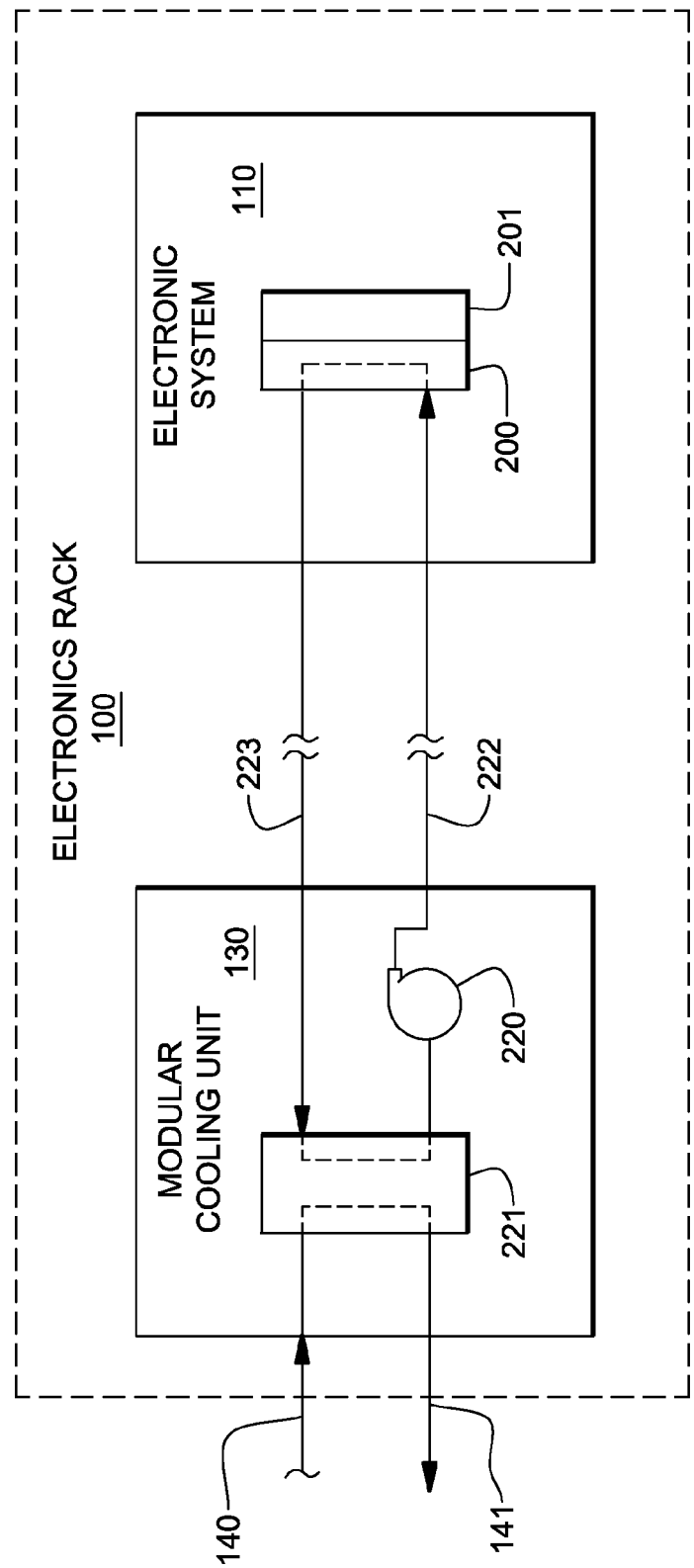
FIG. 2 is a schematic of one embodiment of a coolant-cooled electronic system, wherein an electronic component, such as an electronics card, is indirectly coolant-cooled by system coolant provided by one or more modular cooling units, in accordance with one or more aspects of the present invention.

FIG. 2 schematically illustrates operation of the cooling system of FIG. 1, wherein a coolant-cooled cold plate 200 is shown coupled to an electronics card 201 of an electronic system 110 within the coolant-cooled electronics rack 100. Heat is removed from electronics card 201 via the system coolant circulated via pump 220 through cold plate 200 within the system coolant loop defined by liquid-to-liquid heat exchanger 221 of modular cooling unit 130, lines 222, 223 and cold plate 200. The system coolant loop and modular cooling unit are designed to provide coolant of a controlled temperature and pressure, as well as controlled chemistry and cleanliness to the electronics card(s). Furthermore, the system coolant is physically separate from the less controlled facility coolant in lines 140, 141, to which heat is ultimately transferred.

Figure 3:
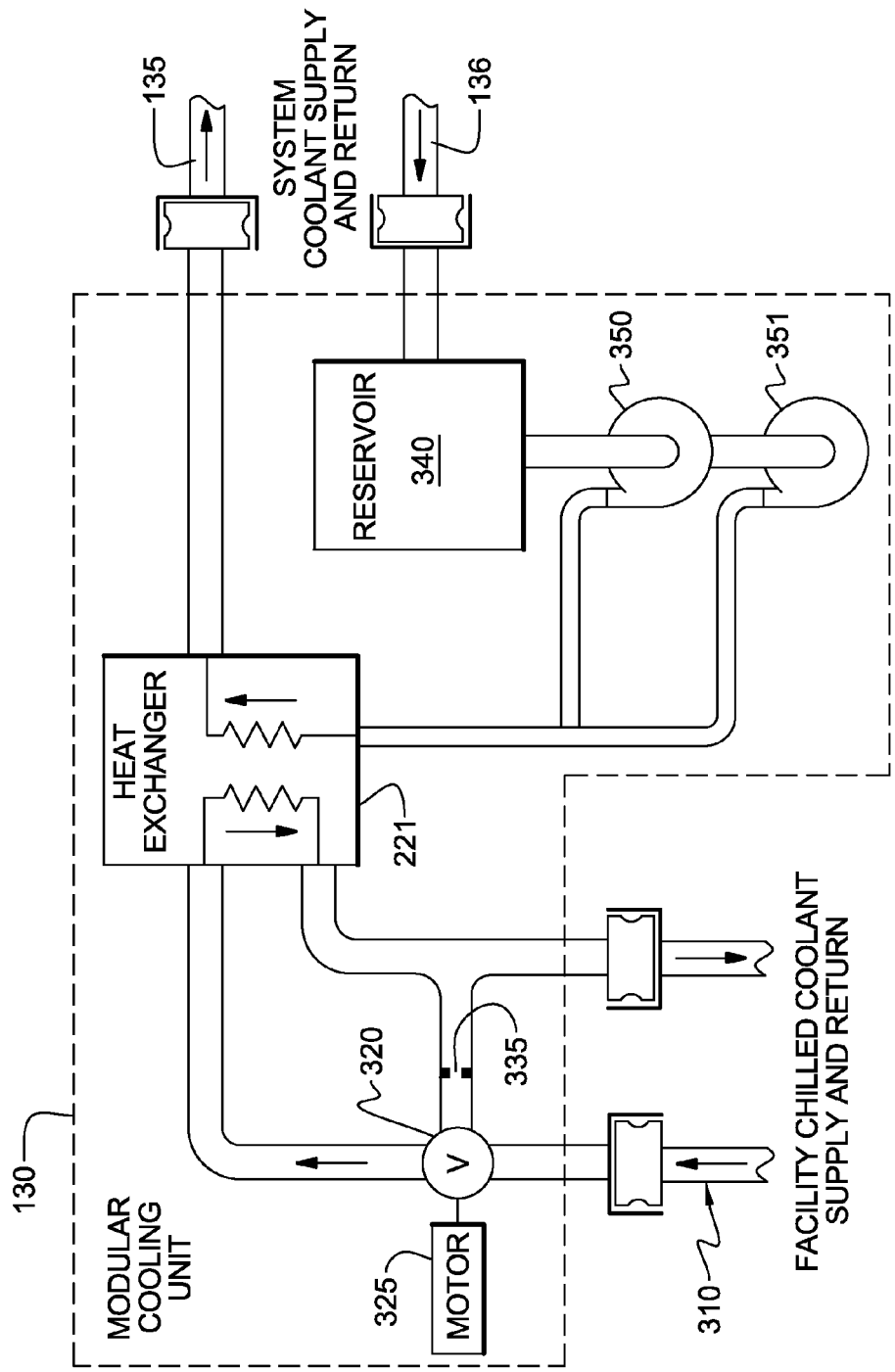
FIG. 3 is a schematic of one embodiment of a modular cooling unit for a coolant-cooled electronics rack such as depicted in FIGS. 1 & 2, in accordance with one or more aspects of the present invention.

FIG. 3 depicts a more detailed embodiment of a modular cooling unit 130, in accordance with an aspect of the present invention. As shown in FIG. 3, modular cooling unit 130 includes a facility coolant loop wherein building chilled, facility coolant is supplied 310 and passes through a control valve 320 driven by a motor 325. Valve 320 determines an amount of facility coolant to be passed through liquid-to-liquid heat exchanger 221, with a portion of the facility coolant possibly being returned directly via a bypass orifice 335. The modular cooling unit further includes a system coolant loop with a reservoir tank 340 from which system coolant is pumped, either by pump 350 or pump 351, into the heat exchanger 221 for conditioning and output thereof, as cooled system coolant to the electronics rack to be cooled. The cooled system coolant is supplied to the system supply manifold and system return manifold of the liquid-cooled electronics rack via the system water supply hose 135 and system water return hose 136.

As noted, an electronics rack may include one or more electronic systems, such as one or more server units, within which packaging density continues to increase, along with power dissipation. These trends necessitate that more and more electronic system components be principally directly or indirectly liquid-cooled, such as with water, refrigerant, etc., rather than air-cooled. Many electronic system architectures also require that certain components be serviceable without interruption of the electronic system. Conventionally, most serviceable or field-replaceable cards or components are air-cooled. A main disadvantage to air-cooled, serviceable components is that packaging and power density is limited, and fan or blower noise associated with the air cooling can become excessive. If serviceable cards or components are to be coolant-cooled (e.g., water, refrigerant, etc.), they would typically be serviced by disconnecting multiple coolant connections, as well as electrical connectors or cables. The disadvantage to such a cooling approach is that the need to disconnect coolant connections within an electronic system creates potential leak paths, and the approach requires a highly-parallel, coolant flow architecture to ensure servicing a component, such as a field-replaceable unit or card, does not interrupt coolant flow to one or more other components not being serviced. Addressing this disadvantage, disclosed herein (in one aspect) are cooling apparatuses and methods for facilitating liquid-coolant cooling of high-power-density, serviceable electronics cards or components, without having to connect or disconnect any coolant connections during insertion or removal of an electronics card.

Generally stated, in one embodiment, the cooling apparatuses disclosed herein include a thermal transfer structure configured to couple to an electronics card or component. Note that as used herein, an "electronics card" may comprise, for instance, a board or substrate upon which one or more electronic components are disposed. In one example, the electronic components may comprise a processor module and one or more support modules, such as one or more memory support modules, and one or more dynamic random access memory (DRAM) modules.

The thermal transfer structure includes, for instance, a clamping structure movable between an opened position and a clamped position. The cooling apparatus further includes a coolant-cooled (e.g., liquid-cooled) structure disposed within, and associated with a receiving slot of, an electronic system within which the electronics card is to be operatively inserted. The coolant-cooled structure resides between the electronics card and, at least partially, the clamping structure with operative insertion of the electronics card into the receiving slot of the electronic system. In operation, the opened position of the clamping structure facilitates insertion of the electronics card into the electronic system with the coolant-cooled structure disposed between the electronics card and, at least partially, the clamping structure, and movement of the clamping structure to the clamped position facilitates clamping of the thermal transfer structure to the coolant-cooled structure, and thereby enhancing thermal conduction of heat from the electronics card to the coolant-cooled structure by providing a good mechanical and thermal coupling to the coolant-cooled structure.

In one embodiment, the thermal transfer structure includes a thermal spreader which has opposite main surfaces comprising a first thermal conduction surface and a second thermal conduction surface. The first thermal conduction surface is configured to couple to the electronics card to facilitate conduction of heat from the electronics card to the thermal spreader. For instance, the first thermal conduction surface may have appropriately sized recesses or regions so that one or more electronic components (e.g., integrated circuit chips or devices) mounted to the electronics card make good thermal contact to the thermal spreader, and in one embodiment, the thermal spreader makes good thermal contact to the card or substrate of the electronics card. When the electronics card with the attached thermal transfer structure is operatively inserted into the electronic system, for example, docked within a respective receiving slot, the coolant-cooled structure resides between the second thermal conduction surface of the thermal spreader and, for instance, a lid of the clamping structure. In the opened position of the clamping structure, insertion of the electronics card into the electronic system is facilitated with the coolant-cooled structure of the electronic system being disposed between the thermal spreader and the lid of the clamping structure, and movement of the clamping structure to the clamped position facilitates clamping of the thermal transfer structure to the coolant-cooled structure, and thus enhanced thermal conduction of heat from the thermal spreader to the coolant-cooled structure.

More specifically, in one embodiment, the coolant-cooled structure may include a liquid-cooled cold plate or a liquid-cooled cold wall resident in the electronic system (e.g., server unit), for instance, within or associated with the receiving slot of the electronic system within which the electronics card is to be operatively inserted. The electronics card may be a high-power-density card assembly containing multiple electronic components, which can mechanically clamp itself, via the thermal transfer structure, to the coolant-cooled structure or cold wall after the electronics card is docked into the receiving slot and plugged into a respective electrical connector(s) resident within the electronic system. The coolant-cooled structure or cold wall may have coolant flowing through it in one or more coolant-carrying channels, and be sufficiently flexible in the direction that it is clamped so that clamping of the coolant-cooled structure to the electronics card via the thermal transfer structure will not put a significant load on the electrical connector(s) of the electronics card or the electrical backplane of the electronic system to which the card is connected. The cooling path from the electronics card to the coolant-cooled structure may be from the electronics card (i.e., the components mounted to the electronics card) through, for instance, a first thermal interface material (TIM1) to the heat spreader of the thermal transfer structure, and then through a second thermal interface material (TIM2) to the coolant-cooled structure. Note that the heat spreader also serves as a base to the mechanism referred to herein as the clamping structure. This structure is employed to clamp the coolant-cooled structure and thermal transfer structure together. The advantage of this cooling apparatus is that a high-power-density electronics card can be efficiently indirectly liquid-cooled via a cold plate and still be serviceable, without disconnecting any coolant connections within the electronic system.

Figure 4:
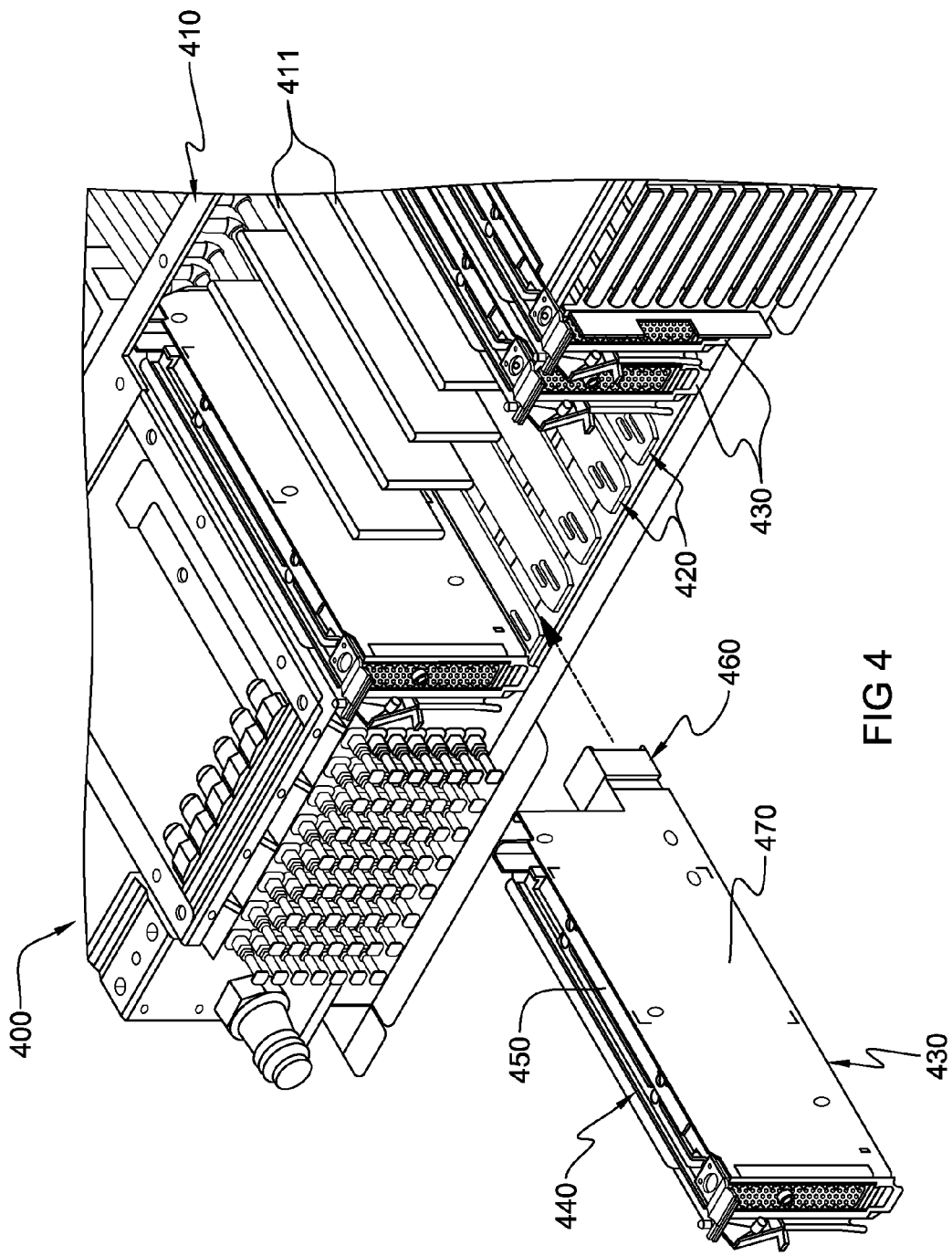
FIG. 4 is a partial isometric view of one embodiment of a coolant-cooled electronic assembly, with an electronics card and associated thermal transfer structure, shown being inserted into a receiving slot of the electronic system, in accordance with one or more aspects of the present invention.

FIG. 4 is a partial embodiment of an electronic system, generally denoted 400, utilizing a cooling apparatus, in accordance with one or more aspects of the present invention. The cooling apparatus includes a cooling apparatus subassembly 410 which comprises a plurality of coolant-cooled structures 411, each of which includes one or more coolant carrying channels through which a coolant, such as water circulates. In the embodiment depicted, the coolant-cooled structures 411 are suspended via the cooling apparatus subsystem 410 within or adjacent to respective receiving slots 420 of the electronic system into which serviceable or field-replaceable units 430 are docked for operative insertion into or undocked for removal from electronic system 400. A field-replaceable unit 430 includes, by way of example only, an electronics card 440 with a thermal transfer structure 450 coupled thereto. The electronics card electrically docks within an interposer card 460, and the resultant assembly is disposed within a cassette 470 (again by way of example only), to facilitate slidable insertion into or removal from a respective receiving opening 420 of electronic system 400. As disclosed herein, the respective coolant-cooled structure 411 disposed within or associated with the receiving slot 420 into which the field-replaceable unit 430 is docked projects into the cassette 470 with insertion of the field-replaceable unit 430 into the receiving slot 420. Once the electronics card is docked, the coolant-cooled structure resides between the electronics card 440 and, at least partially, a clamping structure of the thermal transfer structure 450, as explained below.

By way of further explanation, the electronics card may electrically connect to an electronic system back-plane (e.g., server back-plane), as the field-replaceable unit is slid into the electronic system, or more particular, one of the receiving slots of the electronic system, and a simple latch mechanism (not shown) may be used to secure the field-replaceable unit within the electronic system. The coolant-cooled structure (e.g., liquid-cooled cold wall) associated with the respective receiving slot that the unit slides into is positioned and configured to extend into (for instance) the thermal transfer structure of the replaceable unit so as to be between the electronics card and, at least partially, a clamping structure of the thermal transfer structure. In one assembly approach, before the electronics card is installed, a second thermal interface material (TIM2) is attached to, for instance, the second thermal conduction surface of the heat spreader to which the coolant-cooled (or liquid-cooled) structure is to be clamped. The particular interface material employed is designed to adhere to the heat spreader, yet be releasable from the coolant-cooled structure should the field-replaceable unit be removed or undocked from the electronic system, for instance, for servicing of the electronics card. As the field-replaceable unit slides into the receiving slot, the coolant-cooled structure slides between, for instance, the heat spreader and the lid of the clamping structure. Once the electrical connector(s) is fully plugged, and the field-replaceable unit or electronics card assembly is latched in place, an actuation mechanism, such as an actuator element or screw, may be turned or tightened to cause the clamping structure to clamp the thermal transfer structure and the coolant-cooled structure together in good physical and thermal contact. In one embodiment, a four-bar linkage assembly may be used as part of the clamping structure, movably securing the clamping structure to, for instance, the heat spreader of the thermal transfer structure. These structures and their operation are described further below with reference to the exemplary embodiments of FIGS. 5A-7G.

Figure 5A:
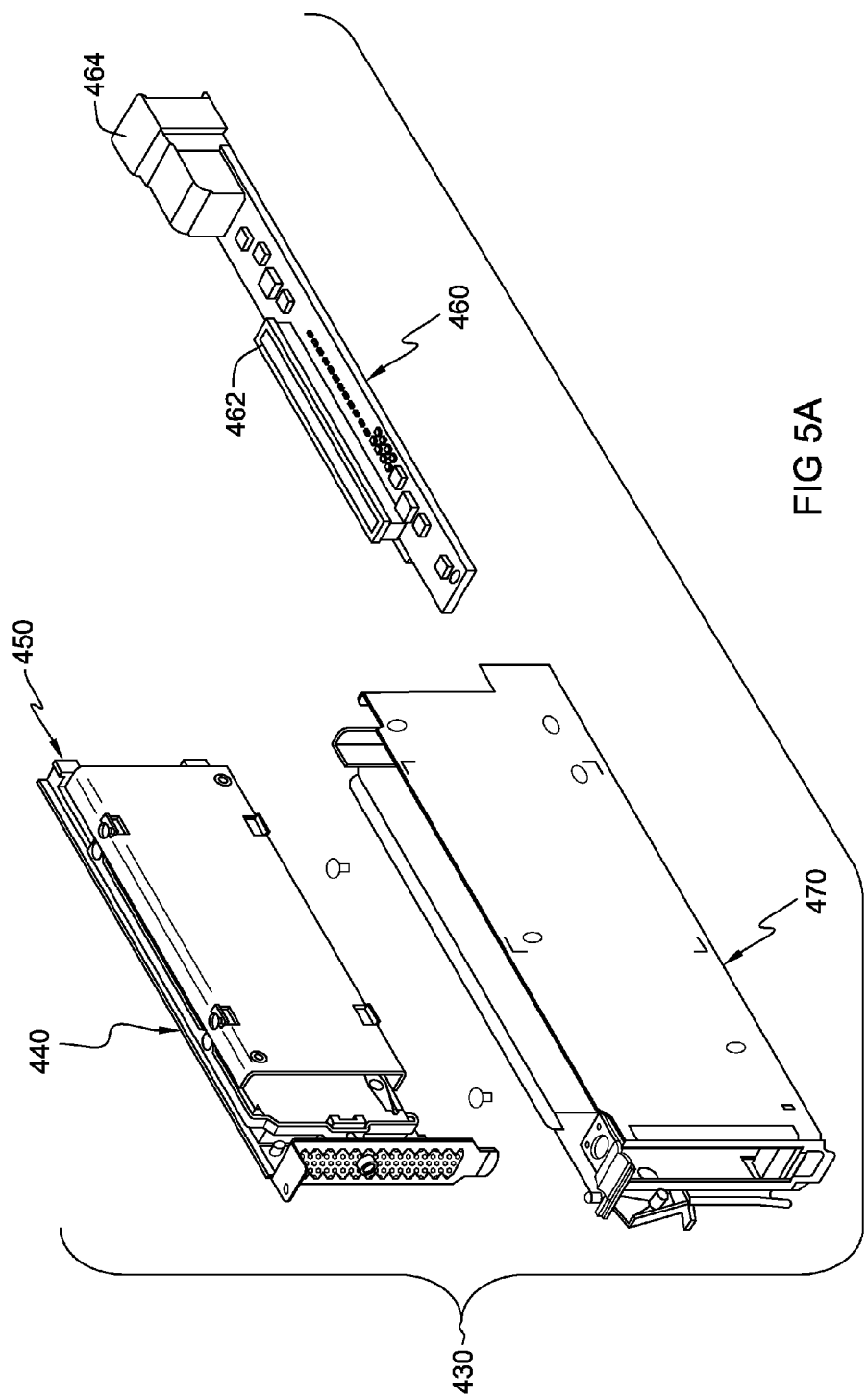
FIG. 5A is a partially exploded view of one embodiment of an electronics card and associated thermal transfer structure, shown exploded from a corresponding cassette chassis and interposer card, in accordance with one or more aspects of the present invention.

FIG. 5A is a partially exploded depiction of one embodiment of the field replaceable unit 430 of FIG. 4. In this embodiment, electronics card 440 is shown mechanically coupled to thermal transfer structure 450, and the electronics card 440 and thermal transfer structure 450 assembly operatively inserts into interposer card 460 disposed within cassette 470. Cassette 470 includes an appropriately sized cassette chassis, and as illustrated, interposer card 460 includes an electronics card socket 462 configured to operatively receive one or more electrical connections of electronics card 440 as the card is operatively positioned within cassette 470, with the interposer card 460 disposed in the lower portion thereof. Interposer card 460 also includes one or more electrical connectors 464 sized and configured to operatively couple to, for instance, an electrical or control back-plane (not shown) of the electronic system (see FIG. 4) within which the electronics card or, more generally, the field-replaceable unit is to be operatively inserted or docked.

Figure 5B:
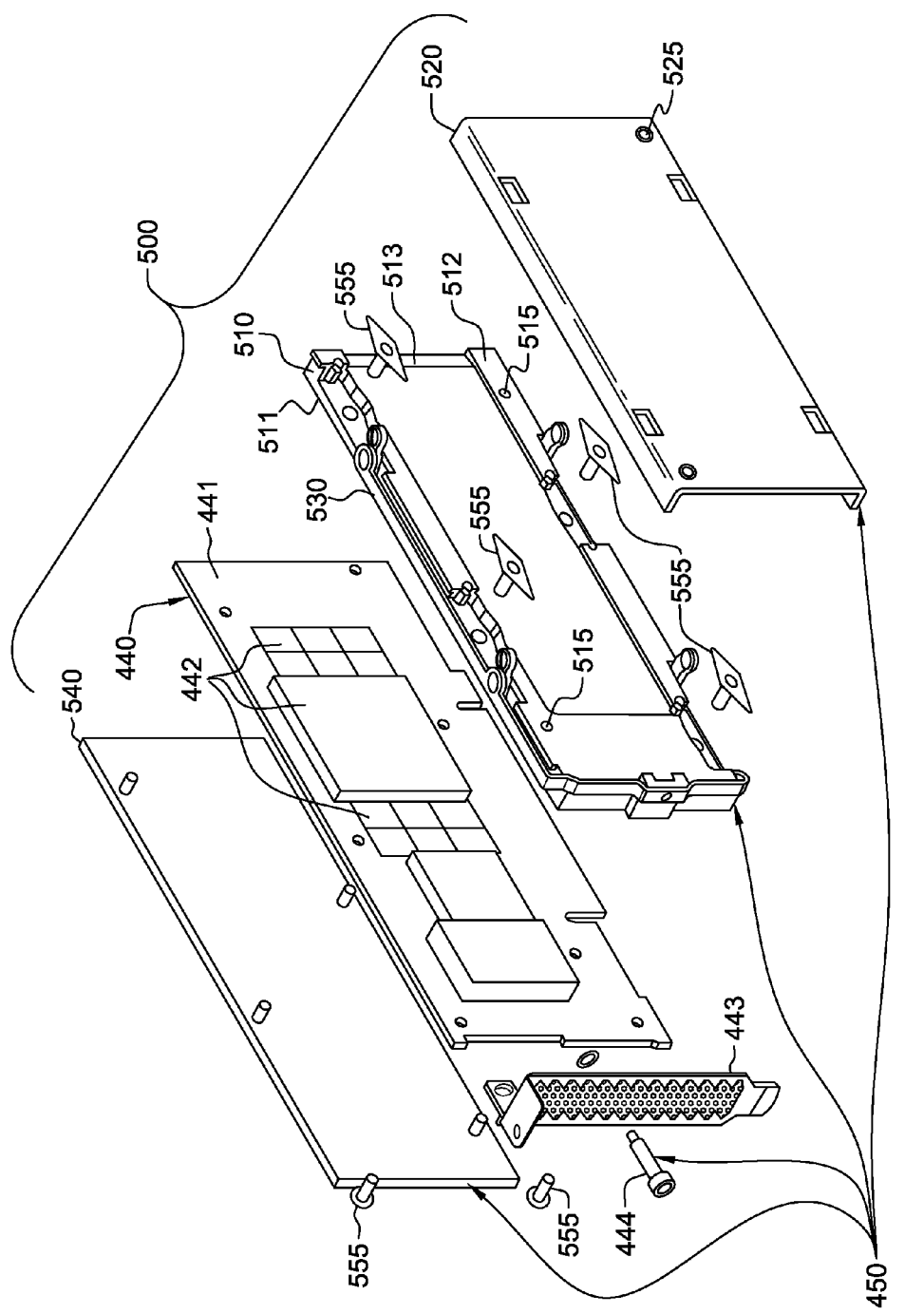
FIG. 5B is a partially exploded view of the electronics card and thermal transfer structure of FIG. 5A, in accordance with one or more aspects of the present invention.

FIG. 5B is a partially exploded view of one embodiment of an electronics card and thermal transfer structure assembly (or electronics card assembly) 500. In this embodiment, electronics card assembly 500 includes electronics card 440 comprising, for instance, a circuit board or substrate 441 to which one or more electronic components 442, such as integrated circuit chips, are mounted. In one embodiment, the one or more electronic components 442 may include a high-power-dissipating processor chip, as well as support chips such as a memory controller, and dynamic random access memory (DRAM) chips, etc.

FIG. 5B also depicts in greater detail one embodiment of a thermal transfer structure 450 such as disclosed herein. This thermal transfer structure 450 includes a thermal spreader 510 and a movable linkage assembly 530 of a clamping structure which includes (in this embodiment) a lid 520. A stiffener 540 is also provided, along with attachment fasters 555, which couple the thermal spreader 510 and stiffener 540 together with electronics card 440 sandwiched between the thermal spreader 510 and stiffener 540. In one embodiment, a first thermal conduction surface 511 of thermal spreader 510 is configured with one or more recesses (not shown) appropriately sized to receive corresponding electronic components 442 in good thermal contact with first thermal conduction surface 511. A second thermal conduction surface 512 of thermal spreader 510 may also include, in one embodiment, a partial recess 513 sized and configured to receivably engage a similarly configured coolant-cooled structure, or a portion thereof, as the electronics card assembly 500 within the field-replaceable unit is operatively inserted into the electronic system in a manner such as described herein.

Thermal spreader 510 and stiffener 540 may couple via a variety of attachment fasteners 555, including, for example, multiple load spring fasteners, which allow spring-biased coupling of the thermal spreader 510 and stiffener 540, with electronics card 440 sandwiched therebetween, and thus ensure good thermal contact between surfaces of the electronic components 442 (and possibly the electronics card 440 itself) and the first thermal conduction surface 511 of the thermal spreader 510. In addition, alignment pins 525 affixed to lid 520 reside within alignment holes 515 in thermal spreader 510, and maintain lid 520 aligned over thermal spreader 510 with movement of the lid between an opened position and a clamped position, as described herein. In this embodiment, a front tailstock 443 may reside at one edge of the electronics card assembly 500, along with an actuator element 444 connected to engage and threadably actuate movable linkage assembly 530 of the clamping structure. In one embodiment, actuator element 444 is an actuation screw which threadably inserts into a threaded opening within movable linkage assembly 530 and allows an operator to rotatably control movement of the assembly 530 and thus a clamping force applied between thermal spreader 510 and lid 520 when the electronics card assembly 500 is in operative position within a corresponding receiving slot of the electronic system, with the coolant-cooled structure (see FIG. 4) thereof disposed between thermal spreader 510 and lid 520.

Figure 5C:
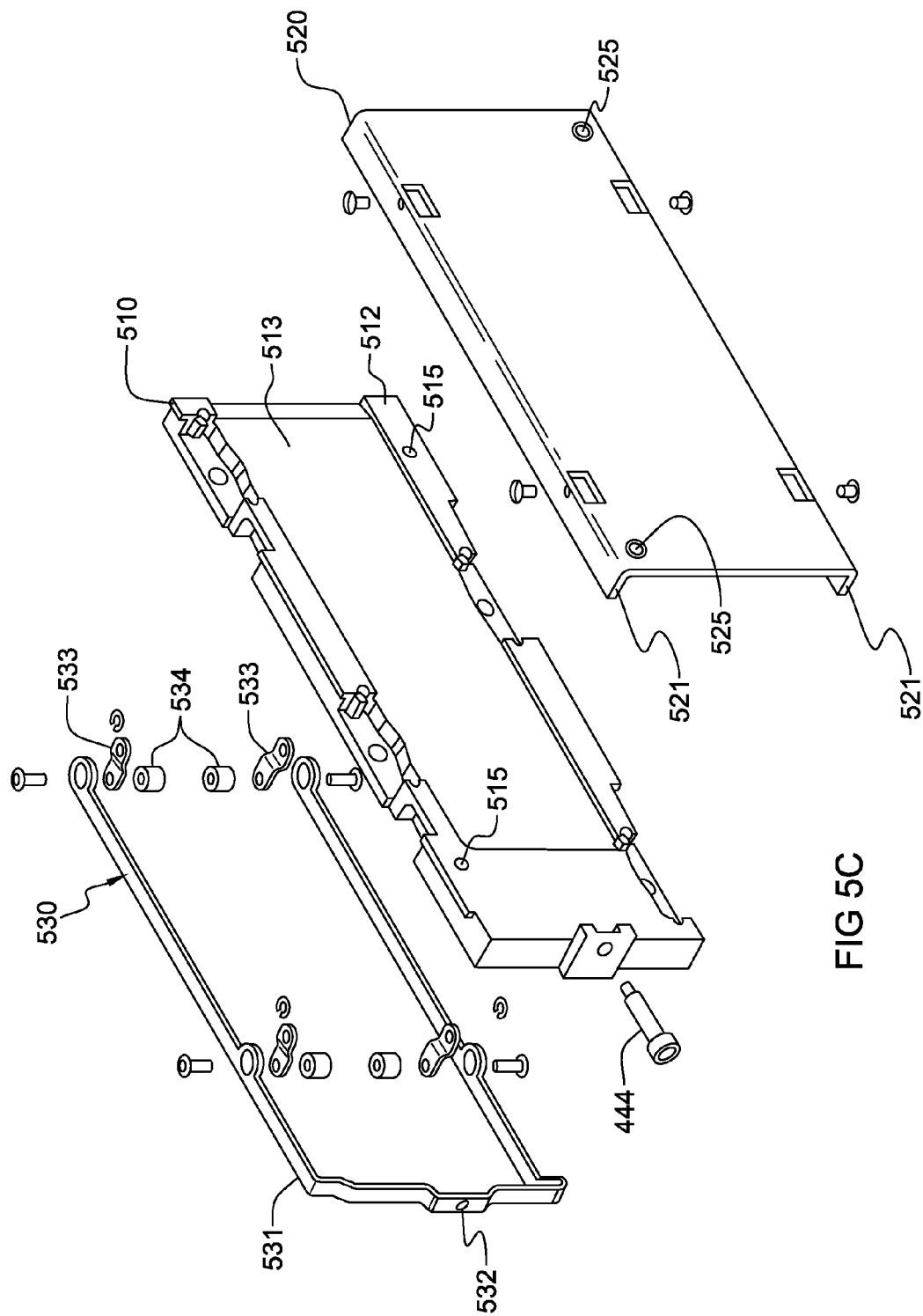
FIG. 5C is a partially exploded view of the thermal spreader, and clamping structure (including a moveable linkage assembly and lid) of the thermal transfer structure of FIGS. 5A & 5B, in accordance with one or more aspects of the present invention.

FIG. 5C depicts an exploded view of the thermal spreader 510 and the clamping structure, including movable linkage assembly 530 and lid 520. In this embodiment, the movable linkage assembly 530 includes a slide structure 531 having a threaded opening 532 at one end sized and positioned to threadably receive actuator element 444. Movable linkages 533 and cam followers 534 are employed to couple slide structure 531, thermal spreader 510 and lid 520 together such that the clamping structure is defined relative to thermal spreader 510. This clamping structure is movable between an opened position and a clamped position. In this embodiment, lid 520 is disposed in spaced opposing relation to second thermal conduction surface 512 of thermal spreader 510, which (as noted) may include a recess 513 sized and configured to at least partially, engagably receive the respective coolant-cooled structure (see FIG. 4) as the field-replaceable unit comprising the electronics card assembly is operatively inserted into a respective receiving slot of the electronic system. Note also with respect to FIG. 5C, that (in one embodiment) lid 520 includes sidewalls 521 which partially wrap around, for instance, the respective coolant-cooled structure once in the clamped position. These sidewalls 521 may be sized to physical contact the thermal spreader, and thereby facilitate enhanced heat transfer. In one embodiment, lid 520 is itself thermally conductive, being fabricated of, for instance, a metal or other thermally conductive material, to further improve heat transfer between the thermal spreader, and thus the electronics card and the coolant-cooled structure.

Figure 6A:
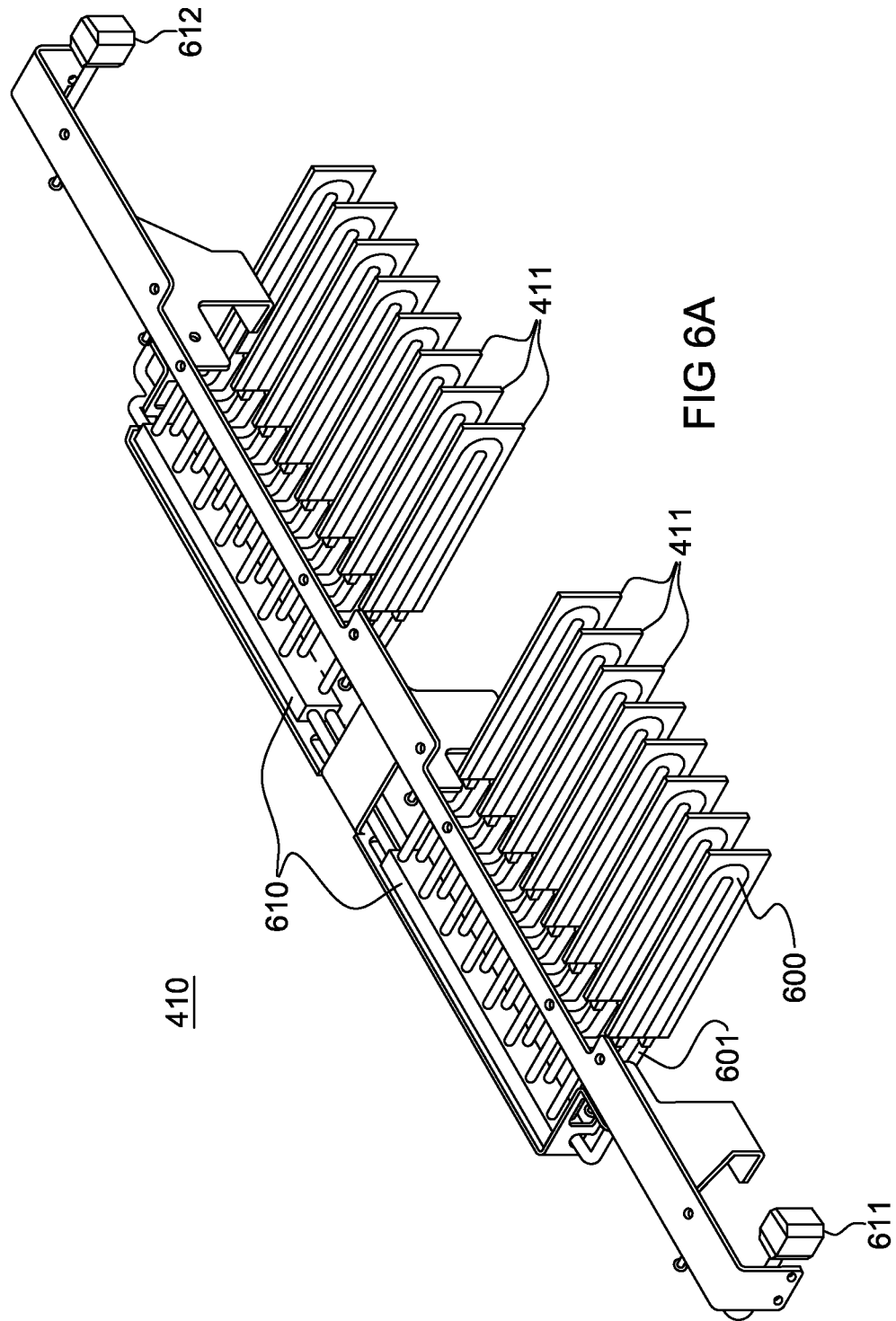
FIG. 6A is a partial embodiment of a cooling apparatus sub-assembly, which includes a plurality of coolant-cooled structures and associated coolant manifolds, for disposition within an electronic system such as depicted in FIG. 4, in accordance with one or more aspects of the present invention.
Figure 6C:
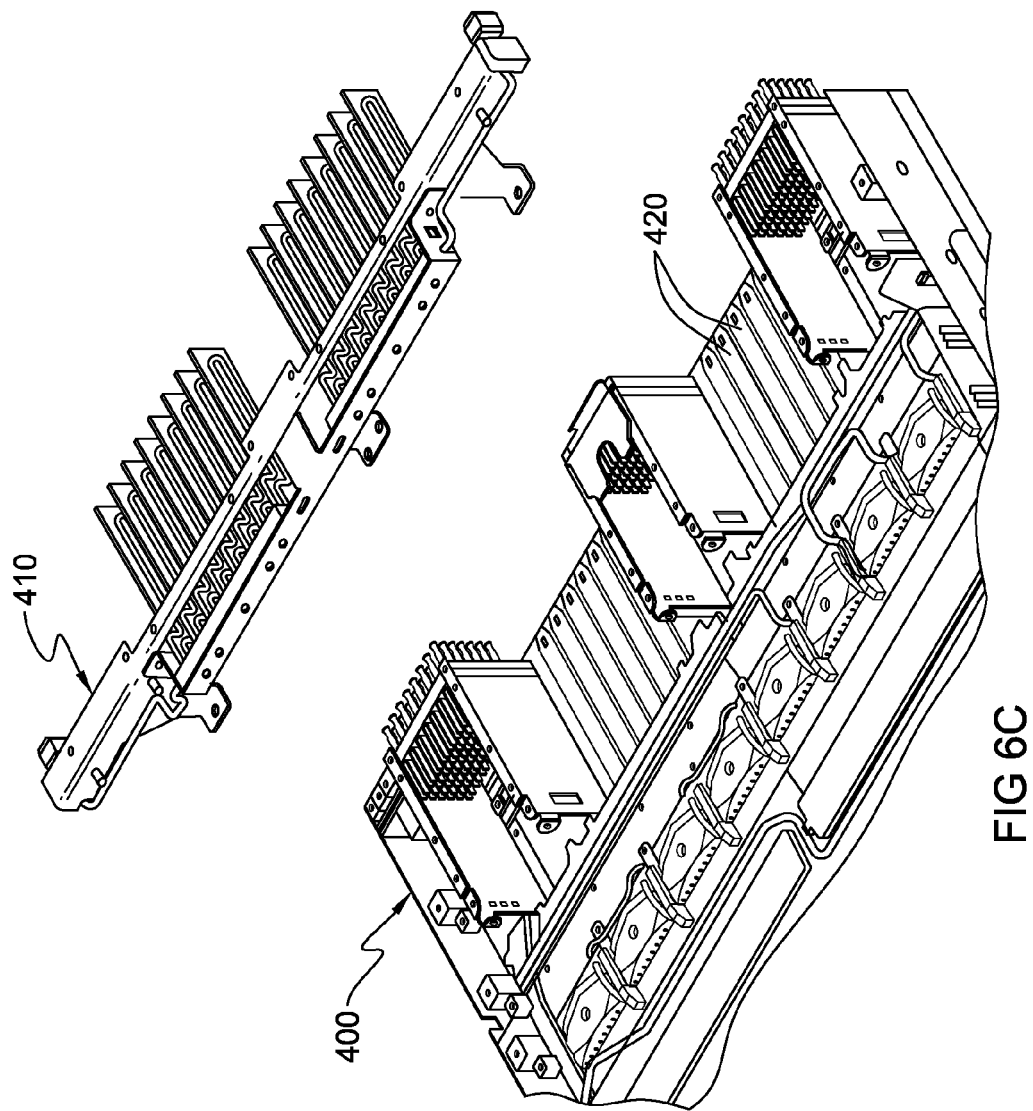
FIG. 6C depicts the cooling apparatus sub-assembly of FIGS. 6A & 6B, partially exploded from one embodiment of an electronic system within which a plurality of electronics cards to be cooled are to be operatively inserted, in accordance with one or more aspects of the present invention.

FIGS. 6A-6C depict one embodiment of cooling apparatus subassembly 410 of the cooling apparatus disclosed herein, and briefly described above in connection with FIG. 4. Referring to FIGS. 6A-6C collectively, two sets of coolant-cooled structures 411 are provided, each configured and positioned to extend into or be associated with a respective receiving slot of (in this example) two different sets of receiving slots in electronic system 400 for receiving electronics card assemblies, or more generally, field-replaceable units, such as described herein. Each coolant-cooled structure 411 includes one or more coolant-carrying channels 600 through which liquid coolant can circulate. In this embodiment, manifolds 610 are provided and coupled to a coolant supply connector 611 and a coolant return connector 612. These manifolds and connectors are configured and coupled in fluid communication to facilitate the flow of coolant through the respective coolant-carrying channels 600 of the coolant-cooled structures 411. In the embodiment depicted, each coolant-cooled structure is a substantially flat cold plate having (for instance) a tube-receiving recess within which a respective coolant-carrying tube 601 resides. The coolant-carrying tubes 601 define, in this example, the coolant-carrying channels through the coolant-cooled structure. In the embodiment depicted, the cold plates are oriented vertically on-edge as liquid-cooled cold walls. As noted, these coolant-cooled structures are positioned within or associated with respective receiving slots of the electronic system. Note with reference to FIGS. 6A-6C that the coolant flowing through the cooling apparatus subassembly 410 is sealed from leaking, notwithstanding insertion or removal of an electronics card assembly. That is, insertion or removal of the field-replaceable units (comprising the electronics card assemblies) is made without any coolant connection being affected.

As illustrated in FIG. 6B, the cooling apparatus subassembly 410 of FIGS. 6A-6C includes (in one embodiment) a manifold bracket 620 and a bulkhead bracket 621, which are sized and configured to provide appropriate support for the manifolds 610 and coolant-cooled structures 411. In one embodiment, the coolant-carrying tubes 601 are rigid tubes which have sufficient support to hold the coolant-cooled structures 411 suspended within or in association with a respective receiving slot of the electronic system.

FIG. 6C depicts the cooling apparatus subassembly 410 partially exploded from one embodiment of electronic system 400, and depicts the coolant-cooled structures 411 aligning over respective receiving slots 420 of the electronic system 400.

FIGS. 7A-7G depict in greater detail operation of one embodiment of the thermal transfer structure of the cooling apparatus disclosed herein.

Figure 7A:
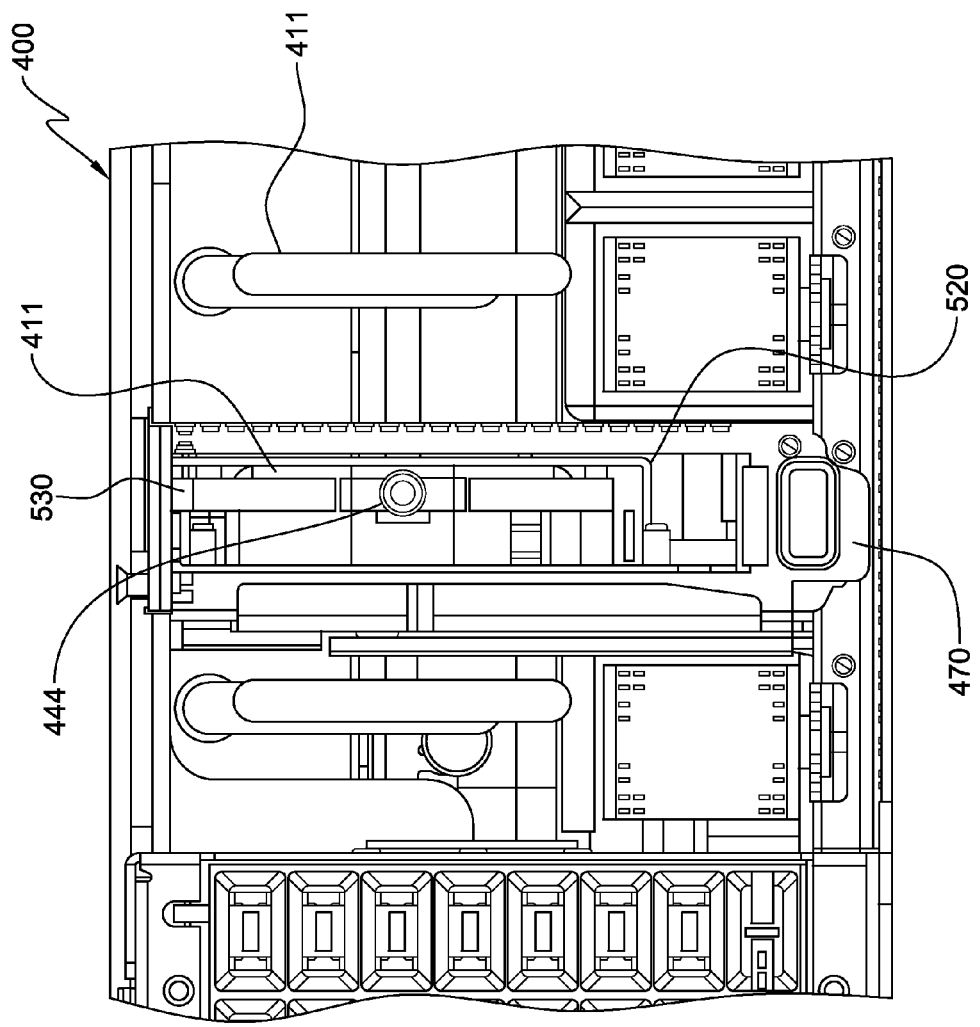
FIG. 7A is a partial elevational view of the electronic system of FIG. 4, showing one electronics card operatively inserted therein, and looking through the cassette with the coolant-cooled structure of the receiving slot shown clamped by the thermal transfer structure, in accordance with one or more aspects of the present invention.

In FIG. 7A, a partial elevational view of an electronic system is depicted, wherein one field-replaceable unit (comprising an electronics card assembly) is shown operatively positioned within a respective receiving slot of electronic system 400. In FIG. 7A, the cassette 470 chassis is not shown or is translucent, actuator element 444 is shown accessible to an operator, and coolant-cooled structure 411 is shown captured by the thermal transfer structure, with the clamping structure comprising, for instance, slidable linkage assembly 530 and lid 520 in clamped position.

FIGS. 7B-7E further depict electronics card assembly 500. By way of example, FIGS. 7B & 7C depict the thermal transfer structure, or more particularly, the clamping structure thereof, in opened position, and FIGS. 7D & 7E depict the clamping structure in clamped position. As illustrated, the lid 520, in both opened position and clamped position, remains in spaced opposing relation to second thermal conduction surface 512 of thermal spreader 510. In the opened position of FIGS. 7B & 7C, lid 520 is spaced further from the second thermal conduction surface 512 of thermal spreader 510 than in the clamped position of FIGS. 7D & 7E. As illustrated in FIGS. 7B & 7C, the spacing in the opened position between the lid and thermal spreader is sufficient to facilitate accommodation of the coolant-cooled structure 411 between the thermal spreader 510 and the lid 520.

Note also with reference to FIG. 7C, that the contouring of the first thermal conduction surface 511 of thermal spreader 510 is provides enhanced physical coupling of the first thermal conduction surface 511 to the electronic components 442, as well as (for example) to the supporting card or substrate 441 of the electronics card 440. The stiffener 540 is shown coupled to the opposite side of the electronics card 440 from the thermal spreader 510.

In the clamped position depicted in FIGS. 7D & 7E, lid 520 is shown moved closer to thermal spreader 510 of the thermal transfer structure to facilitate clamping of the coolant-cooled structure 411 between the lid 520 and the thermal spreader 510 of the thermal transfer structure. This is achieved (in one embodiment) by actuation of the actuator element 444 by, for instance, an operator or service technician, after operatively inserting the electronics card assembly into the electronic system.

FIGS. 7F & 7G schematically depict operation of the movable linkage assembly and alignment pins 525 coupling the lid to the thermal spreader, and in particular, illustrate the opened position and clamped position, respectively, of lid 520 relative to thermal spreader 510 such as disclosed herein. In FIG. 7F, linkages 533 are shown extended, with lid 520 spaced further from the second thermal conduction surface 512 of thermal spreader 510 and the slide structure 531 disposed at one side of elongate, slide-receiving openings 700 in thermal spreader 510. In the clamped position, the actuator element mechanism has been turned to apply an actuation force which moves the slide structure 531 within the respective elongate, slide-receiving openings 700 of the thermal spreader 510 as shown, causing lid 520 to collapse towards thermal spreader 510, but still remain spaced therefrom. The sizing of the clamping structure components, and in particular, the slide linkage assembly 530 and the alignment pins 525 and alignment holes 515, are chosen so that the spacing in the clamped position between lid 520 and thermal spreader 510 provides good physical contact or clamping force between the thermal transfer structure and the coolant-cooled structure associated with the respective receiving slot in the electronics system within which the electronics card is operatively docked.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method of fabricating a cooling apparatus, the method comprising:
    providing a thermal transfer structure to couple to an electronics card and facilitate transfer of heat from the electronics card, the thermal transfer structure comprising:
        a clamping structure movable between an opened position and a clamped position, the clamping structure comprising a lid spaced from the electronics card when the thermal transfer structure is coupled to the electronics card; and
    providing a coolant-cooled structure to reside within and electronic system, and be associated with a receiving slot of the electronic system within which the electronics card is to be operatively inserted, the coolant-cooled structure extending into the thermal transfer structure and residing between the electronics card and the lid of the clamping structure when the thermal transfer structure is coupled to the electronics card and the electronics card is operatively inserted into the receiving slot of the electronic system, wherein the opened position of the clamping structure facilitates insertion of the electronics card into the electronic system with the coolant-cooled structure disposed between the electronics card and the lid, and movement of the clamping structure to the clamped position facilitates clamping of the thermal transfer structure, including the lid to the coolant-cooled structure, and thermal conduction of heat from the electronics card to the coolant-cooled structure.

2. The method of claim 1, wherein the thermal transfer structure further comprises a thermal spreader comprising a first thermal conduction surface and a second thermal conduction surface, the first thermal conduction surface being coupled to the electronics card to facilitate conduction of heat from the electronics card to the thermal spreader, wherein the coolant-cooled structure resides between the thermal spreader and the lid of the clamping structure with docking of the electronics card in the electronics system, and wherein the opened position the clamping structure facilitates docking of the electronics card in the electronics system with the coolant-cooled structure disposed between the thermal spreader and, at least partially, the clamping structure, and movement of the clamping structure to the clamped position facilitates conduction of heat from the thermal spreader to the coolant-cooled structure.

3. The method of claim 2, wherein in the opened position of the clamping structure, the lid is spaced further from the second thermal conduction surface of the thermal spreader than in the clamped position.

4. The method of claim 2, wherein the lid is movably coupled to the thermal spreader via a movable linkage assembly, and wherein the movable linkage assembly is actuatable to move the lid between the opened position and the clamped position via an actuator element threadably coupled to the movable linkage assembly.

5. The method of claim 2, wherein the lid is thermally conductive and configured to partially wrap around the coolant-cooled structure and contact the thermal spreader when in the clamped position with the electronics card operatively inserted into the receiving slot of the electronic system.

6. The method of claim 2, wherein the thermal transfer structure further comprises a stiffener, the thermal spreader being coupled to a first side of the electronics card and the stiffener being coupled to a second side of the electronics card, the first side and the second side of the electronics card being opposite sides of the electronics card, and wherein the thermal transfer structure further comprises multiple spring-biased attachment mechanisms securing the thermal spreader and the stiffener together with the electronics card sandwiched between the thermal spreader and the stiffener, and wherein the clamping structure is movably coupled to the thermal spreader.

7. The method of claim 2, wherein the thermal transfer structure and electronics card reside within a cassette, and the electronics card is placed in operative position within the electronic system by docking the cassette within the receiving slot in the electronic system, the cassette including an opening sized to facilitate disposition of the coolant-cooled structure between the thermal spreader and, at least partially, the clamping structure with docking of the cassette into the electronics system.

8. The method of claim 2, wherein the thermal spreader includes a recess in the second thermal conduction surface configured to at least partially receive the coolant-cooled structure therein with clamping of the coolant-cooled structure by movement of the clamping structure to the clamped position.

9. The method of claim 1, wherein the coolant-cooled structure comprises at least one coolant-carrying channel facilitating the flow of coolant therethrough, and wherein the electronics card is insertable into or removable from the electronic system without interrupting flow of coolant through the at least one coolant-cooled channel of the coolant-cooled structure.

10. The method of claim 9, wherein the electronics card is disposed on edge, being oriented vertically when operatively inserted into the electronic system, and the coolant-cooled structure comprises a thermally conductive plate suspended within the receiving slot of the electronic system, the electronics card being operatively inserted into the receiving slot of the electronic system, and the thermally conductive plate comprising the at least one coolant-carrying channel.

11. A method of fabricating a coolant-cooled electronic assembly, the method comprising:
  providing an electronic system comprising:
    at least one receiving slot configured to facilitate operative insertion of the at least one electronics card into the electronic system; and
    at least one coolant-cooled structure disposed within the electronic system and associated with the at least one receiving slot, the at least one coolant-cooled structure comprising at least one coolant-carrying channel; and
  providing a cooling apparatus comprising at least one thermal transfer structure, one thermal transfer structure of the at least one thermal transfer structure being coupled to one electronics card of the at least one electronics card, the one thermal transfer structure comprising:
    a clamping structure movable between an opened position and a clamped position, the clamping structure comprising a lid spaced from the one electronics card; and
  wherein with operative insertion of the one electronics card into one receiving slot of the at least one receiving slot of the electronic system, the one coolant-cooled structure associated with the one receiving slot extends into the one thermal transfer structure and resides between the one electronics card and the lid of the clamping structure, and wherein the opened position of the clamping structure facilitates operative insertion of the one electronics card into the one receiving slot of the electronic system with the coolant-cooled structure extending into the one thermal transfer structure between the one electronics card and the lid of the clamping structure, and movement of the clamping structure to the clamped position facilitates clamping of the one thermal transfer structure, including the lid, to the one coolant-cooled structure, and thermal conduction of heat from the one electronics card to the one coolant-cooled structure.

12. The method of claim 11, wherein the electronic system comprises a plurality of receiving slots configured to facilitate operative insertion of a plurality of electronics cards into the electronic system, and a plurality of coolant-cooled structures associated with the plurality of receiving slots, each coolant-cooled structure being disposed within a respective receiving slot of the plurality of receiving slots, and each coolant-cooled structure comprising at least one coolant-carrying channel, and wherein providing the cooling apparatus further comprises providing a plurality of thermal transfer structures, each thermal transfer structure being coupled to a respective electronics card of the plurality of electronics cards.

13. The method of claim 11, wherein the one thermal transfer structure further comprises a thermal spreader comprising a first thermal conduction surface and a second thermal conduction surface, the first thermal conduction surface being coupled to the one electronics card to facilitate conduction of heat from the one electronics card to the thermal spreader, wherein the one coolant-cooled structure resides between the thermal spreader and, at least partially, the lid of the clamping structure with docking of the one electronics card in the electronic system, and wherein the opened position of the clamping structure facilitates docking of the one electronics card in the electronic system with the one coolant-cooled structure disposed between the thermal spreader and, at last partially, the clamping structure, and movement of the clamping structure to the clamped position facilitates thermal conduction of heat from the thermal spreader to the one coolant-cooled structure.

14. The method of claim 13, wherein in the opened position of the clamping structure, the lid is spaced further from the second thermal conduction surface of the thermal spreader than in the clamped position.

15. The method of claim 13, wherein the lid is movably coupled to the thermal spreader via a movable linkage assembly, and wherein the movable linkage assembly is actuatable to move the lid between the opened position and the clamped position via an actuator element threadably coupled to the movable linkage assembly.

16. The method of claim 13, wherein the thermal transfer structure further comprises a stiffener, the thermal spreader being coupled to a first side of the electronics card and the stiffener being coupled to a second side of the electronics card, the first side and the second side of the electronics card being opposite sides of the electronics card, and wherein the thermal transfer structure further comprises multiple spring-biased attachment mechanisms securing the thermal spreader and the stiffener together with the electronics card sandwiched between the thermal spreader and the stiffener, and wherein the clamping structure is movably coupled to the thermal spreader.

17. The method of claim 13, wherein the one thermal transfer structure and the one electronics card reside within a cassette, and the electronics card is placed in the operative position within the electronic system by docking the cassette within the one receiving slot in the electronics system, the cassette including an opening sized to facilitate disposition of the one coolant-cooled structure between the thermal spreader and, at least partially, the clamping structure with docking of the cassette into the electronics system.

* * * * *